(12) United States Patent
Watanabe et al.

(10) Patent No.: US 11,756,909 B2
(45) Date of Patent: Sep. 12, 2023

(54) SEMICONDUCTOR STORAGE DEVICE AND METHOD OF MANUFACTURING SEMICONDUCTOR STORAGE DEVICE

(71) Applicant: Kioxia Corporation, Tokyo (JP)

(72) Inventors: Shinya Watanabe, Yokkaichi (JP); Shinya Arai, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 3 days.

(21) Appl. No.: 17/203,990

(22) Filed: Mar. 17, 2021

(65) Prior Publication Data

US 2022/0077089 A1 Mar. 10, 2022

(30) Foreign Application Priority Data

Sep. 7, 2020 (JP) ................................ 2020-150045

(51) Int. Cl.
*H01L 25/065* (2023.01)
*H01L 23/00* (2006.01)
*H01L 25/18* (2023.01)
*H01L 25/00* (2006.01)

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..... H01L 24/08; H01L 24/80; H01L 25/0657; H01L 25/18; H01L 25/50; H01L 2224/08145; H01L 2224/80895; H01L 2924/1431; H01L 2224/80896; H01L 2924/14511

See application file for complete search history.

(56) References Cited

U.S. PATENT DOCUMENTS

| | | |
|---|---|---|
| 2018/0261575 A1 | 9/2018 | Tagami et al. |
| 2018/0277497 A1 | 9/2018 | Matsuo |
| 2020/0286842 A1* | 9/2020 | Sanuki .................. H01L 24/09 |
| 2020/0286990 A1* | 9/2020 | Uchiyama ......... H01L 21/76275 |
| 2022/0084970 A1* | 3/2022 | Tomimatsu ........... H01L 23/535 |

FOREIGN PATENT DOCUMENTS

| | | |
|---|---|---|
| JP | 2018-163970 A | 10/2018 |
| TW | 201933546 A | 8/2019 |

* cited by examiner

*Primary Examiner* — Thanh Y. Tran
(74) *Attorney, Agent, or Firm* — Oblon, McClelland, Maier & Neustadt, L.L.P.

(57) ABSTRACT

According to one embodiment, a semiconductor storage device includes a first chip and a second chip. The first chip includes a first substrate, a transistor, and a first pad. The second chip includes a second pad, a memory cell array, and a second substrate. The second pad is on the first pad. The second chip is bonded to the first chip. The first chip and the second chip includes, when viewed in a first direction orthogonal to the first substrate, a first region and a second region. The first region includes the memory cell array. The second region surrounds an area around the first region and includes a wall extending from the first substrate to the second substrate. The second substrate includes a first opening passing through the second substrate in the second region.

20 Claims, 13 Drawing Sheets

SEMICONDUCTOR STORAGE DEVICE AND METHOD OF MANUFACTURING SEMICONDUCTOR STORAGE DEVICE

CROSS-REFERENCE TO RELATED APPLICATION

This application is based upon and claims the benefit of priority from Japanese Patent Application No. 2020-150045, filed Sep. 7, 2020; the entire contents of which are incorporated herein by reference.

FIELD

Embodiments described herein relate generally to a semiconductor storage device and a method of manufacturing a semiconductor storage device.

BACKGROUND

A semiconductor storage device is manufactured by bonding devices in which a plurality of circuits or elements are formed.

DETAILED DESCRIPTION

According to one embodiment, a semiconductor storage device includes a first chip and a second chip. The first chip includes a first substrate, a transistor, and a first pad. The transistor is on the first substrate. The first pad is above the transistor. The second chip includes a second pad, a memory cell array, and a second substrate. The second pad is on the first pad. The memory cell array is above the second pad and includes a plurality of memory cells. The second substrate is above the memory cell array. The second chip is bonded to the first chip. The first chip and the second chip includes, when viewed in a first direction orthogonal to the first substrate, a first region and a second region. The first region includes the memory cell array. The second region surrounds an area around the first region and includes a wall extending from the first substrate to the second substrate. The second substrate includes a first opening passing through the second substrate in the second region.

Hereinafter, a semiconductor storage device of an embodiment will be described with reference to the drawings. In the following description, the same reference signs are applied to configurations having the same or similar function. Further, duplicate description of those configurations may be omitted. The drawings are schematic or conceptual drawings, and relationships between thicknesses and widths of parts, a ratio of sizes between parts, and the like are not necessarily the same as those of actual parts. In this specification, the term "connect" is not limited to a case of being physically connected and also includes a case of being electrically connected.

First, an X direction, a Y direction, and a Z direction will be defined. The X direction and the Y direction are directions substantially parallel to a surface of a first substrate 10, which will be described below. The X direction and the Y direction are substantially orthogonal to each other. The Z direction is a direction substantially orthogonal to the X direction and the Y direction and directed away from the first substrate 10. However, these expressions are used for the sake of convenience and do not restrict a direction of gravity. In the embodiment, the Z direction is an example of "a first direction".

First Embodiment

Figure 1:
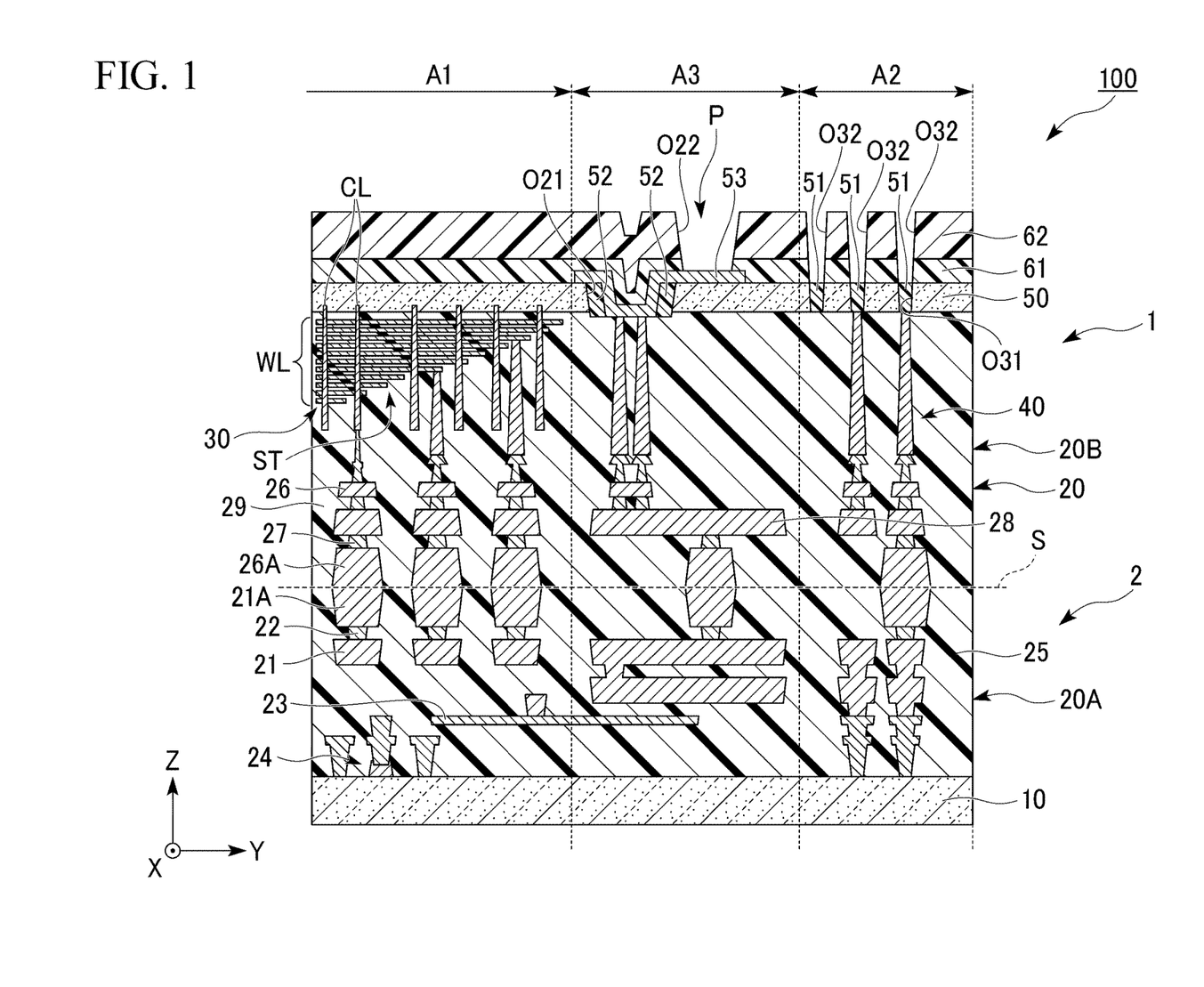
FIG. 1 is a cross-sectional view showing a semiconductor storage device of a first embodiment.

FIG. 1 is a cross-sectional view of a semiconductor memory 100 of a first embodiment. The semiconductor memory 100 is a nonvolatile semiconductor storage device and is, for example, a NAND flash memory. The semiconductor memory 100 is a three-dimensional memory in which an array chip 1 and a circuit chip 2 are bonded to each other. The array chip 1 is an example of a second chip. The circuit chip 2 is an example of a first chip. The array chip 1 and the circuit chip 2 are bonded to each other at a bonding surface S. The circuit chip 2 functions as a control circuit (logic circuit) for controlling operation of the array chip 1.

The semiconductor memory 100 includes the first substrate 10, a laminate 20, a second substrate 50, and insulating layers 61 and 62.

The first substrate 10 is a substrate of the circuit chip 2. For example, the first substrate 10 is a silicon substrate. Portions of first substrate 10 serve as a source region and a drain region of transistors 24.

The laminate 20 is provided on the first substrate 10. The laminate 20 includes a laminate 20A and a laminate 20B. The laminate 20A is laminated on the first substrate 10. The laminate 20B is in contact with the second substrate 50. The first substrate 10 and the laminate 20A constitute the circuit chip 2. The second substrate 50 and the laminate 20B constitute the array chip 1.

The laminate 20A includes a plurality of pads 21, a plurality of contact plugs 22, a plurality of wirings 23 (i.e., electrical interconnections), a plurality of transistors 24, and an insulating film 25. The pads 21 are provided above the transistors 24. The plurality of pads 21 includes pads 21A that are exposed to the bonding surface S. The pads 21A exposed to the bonding surface S are an example of first pads. The transistors 24 are electrically connected to any of the pads 21, the contact plugs 22, and the wirings 23.

The laminate 20R includes a plurality of pads 26, a plurality of contact plugs 27, a plurality of wirings 28 (i.e., electrical interconnections), a memory cell array 30, and an insulating film 29. The plurality of pads 26 includes pads 26A that are exposed to the bonding surface S. The pads 26A exposed to the bonding surface S are an example of second pads. The pads 26A are provided on the pads 21A.

Each of the pads 21 and 26, the contact plugs 22 and 27, and the wirings 23 and 28 connects the memory cell array 30 and the plurality of transistors 24 to each other. Each of the pads 21 and 26, the contact plugs 22 and 27, and the wirings 23 and 28 includes copper (Cu) or aluminum (Al), for example. The pads 21 and 26 are electrodes having certain regions within an XY plane. The pads 21 of the array chip 1 and the pads 26 of the circuit chip 2 are joined to each other with the bonding surface S sandwiched therebetween. The contact plugs 22 and 27 are wirings (i.e., electrical interconnections) extending in the Z direction and electrically connecting different layers to each other. The wirings 23 and 28 are wirings (i.e., electrical interconnections) extending in any direction within an XY plane. The pads 21, the contact plugs 22, and the wirings 23 are provided above the first substrate 10. The pads 26, the contact plugs 27, and the wirings 28 are provided above the laminate 20A inside the laminate 20B. Each of the transistors 24 included in the circuit chip 2 and is provided on the first substrate 10. The transistors 24 control the memory cell array 30. The transistors 24 are electrically connected to the memory cell array 30 via the pads 21 and 26, the contact plugs 22 and 27, and the wirings 23 and 28. The insulating films 25 and 29 are interlayer insulating films for insulating the layers from each other. For example, the insulating films 25 and 29 are laminates of a silicon oxide film and a silicon carbonitride film. Openings for the pads 21 and 26, the contact plugs 22 and 27, the wirings 23 and 28, and the like are formed utilizing the difference between etching rates of the silicon oxide film and the silicon carbonitride film.

Figure 2:
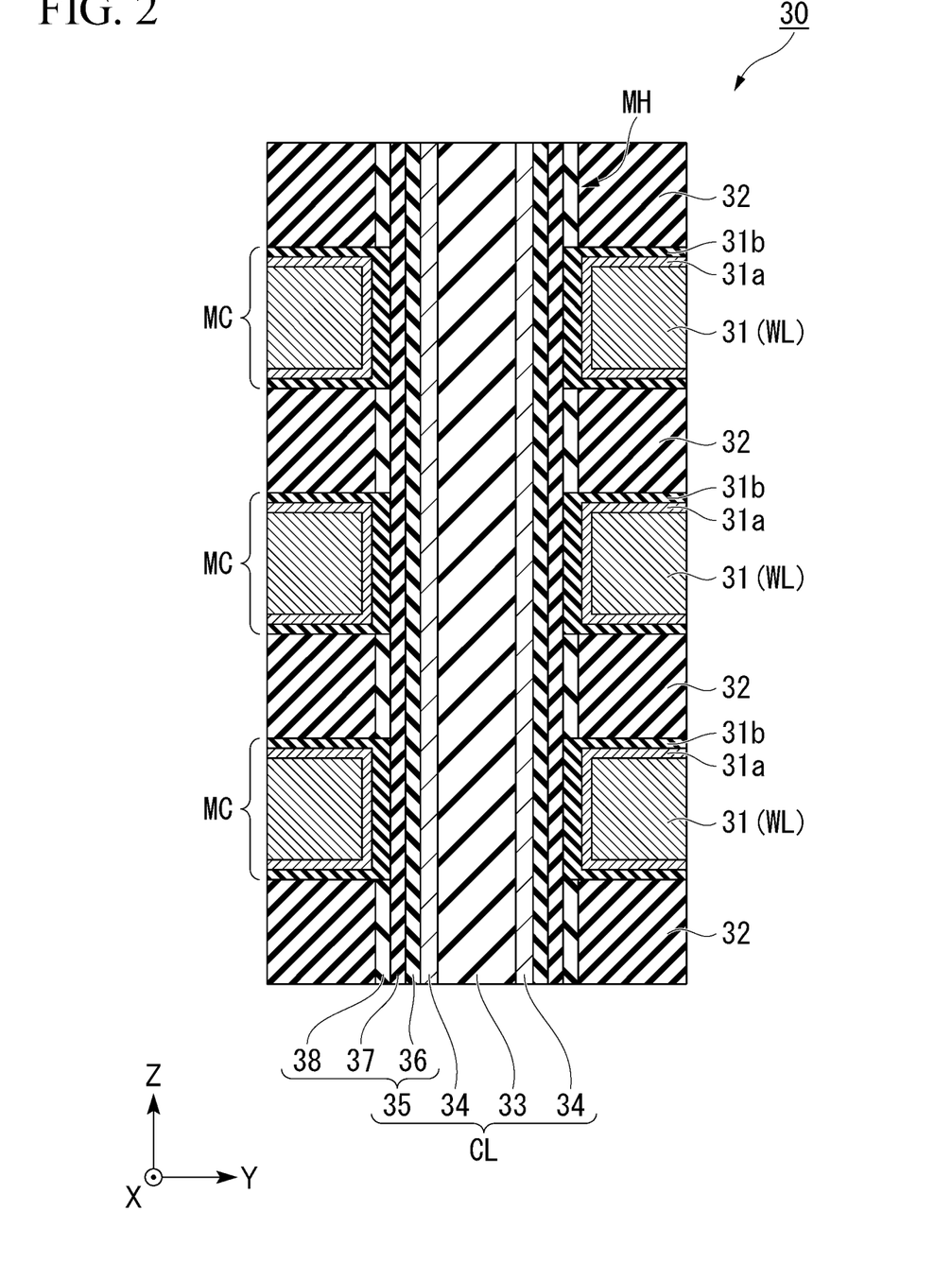
FIG. 2 is a cross-sectional view showing a pillar of the semiconductor storage device of the first embodiment.

The memory cell array 30 is provided under the second substrate 50. The memory cell array 30 is provided above the pads 26A. The memory cell array 30 is included in the array chip 1. The memory cell array 30 is laminated on the second substrate 50 at the time of manufacturing. FIG. 2 is an enlarged cross-sectional view of a part in the vicinity of a pillar CL of the memory cell array 30 of the first embodiment.

The memory cell array 30 includes a plurality of conductive layers 31, a plurality of insulating layers 32, and pillars CL. The conductive layers 31 and the insulating layers 32 are alternately laminated.

The plurality of conductive layers 31 extend in each of the X direction and the Y direction. For example, the conductive layers 31 are made of tungsten or polysilicon into which an impurity is doped. The number of conductive layers 31 is arbitrary. The conductive layers 31 serve as a drain side selection gate SGD, word lines WL, and a source side selection gate SGS. The drain side selection gate SGD, the word lines WL, and the source side selection gate SGS are exposed in a stepped region ST of the memory cell array 30 and are connected to the contact plugs 27.

The plurality of insulating layers 32 extend in each of the X direction and the Y direction. For example, the insulating layers 32 include silicon oxide. The insulating layers 32 are provided between the conductive layers 31 and the second substrate 50 and between conductive layers 31 adjacent to each other in the Z direction. The insulating layers 32 insulate adjacent conductive layers 31 from each other. The number of insulating layers 32 depends on the number of conductive layers 31.

The plurality of pillars CL are provided inside the memory cell array 30. Each of the pillars CL extends in the Z direction. For example, each of the pillars CL passes through the plurality of conductive layers 31 and the plurality of insulating layers 32 which are alternately laminated in the 7 direction. For example, the pillars CL have a circular or oval shape in a plan view in the Z direction.

Each of the pillars CL includes a core 33, a semiconductor body 34, and a memory film 35 in order from the inner side. The pillars CL are inside memory holes MH.

The core 33 extends in the Z direction and has a columnar shape. For example, the core 33 includes silicon oxide. The core 33 is provided inside the semiconductor body 34.

The semiconductor body 34 extends in the Z direction. The semiconductor body 34 is connected to a conductive region functioning as a source line (which will be described below) of the second substrate 50. The semiconductor body 34 covers an outer surface of the core 33. For example, the semiconductor body 34 includes silicon. For example, the silicon included in the semiconductor body 34 is polysilicon in which amorphous silicon is crystallized.

The memory film 35 extends in the Z direction. The memory film 35 covers an outer surface of the semiconductor body 34. The memory film 35 is provided between an inner surface of the memory hole MH and an outer surface of the semiconductor body 34. For example, the memory film 35 includes a tunnel insulating film 36 and an electric charge storage film 37. The tunnel insulating film 36 is closer to the semiconductor body 34 than the electric charge storage film 37 is.

The tunnel insulating film 36 is provided between the electric charge storage film 37 and the semiconductor body 34. For example, the tunnel insulating film 36 includes silicon oxide, or silicon oxide and silicon nitride. The tunnel insulating film 36 is a potential barrier between the semiconductor body 34 and the electric charge storage film 37.

The electric charge storage film 37 is provided between each of the insulating layers 32 and the conductive layers 31 and the tunnel insulating film 36. For example, the electric charge storage film 37 includes silicon nitride. Each of parts where the electric charge storage film 37 and each of the plurality of conductive layers 31 intersect each other functions as a memory cell MC. The memory cell MC retains data in accordance with the presence or absence of electric charge inside the part (electric charge storage) where the electric charge storage film 37 and the conductive layers 31 intersect each other, or in accordance with the amount of electric charge stored inside the part (electric charge storage). The electric charge storage is provided between each of the conductive layers 31 and the semiconductor body 34, and an insulating material surrounds an area around the electric charge storage.

A block insulating film 31a and a barrier film 31b may be provided between each of the conductive layers 31 and the insulating layers 32 and between each of the conductive layers 31 and the memory film 35. The block insulating film 31a curbs back-tunneling. Back-tunneling is a phenomenon in which electric charge from the conductive layer 31 returns to the memory film 35. For example, the block insulating film 31a is a laminated structure layer in which a silicon oxide film, a metal oxide film, and a plurality of insulating films are laminated. Aluminum oxide is an example of a metal oxide. For example, the barrier film 31b is made of titanium nitride or a laminated structure layer of titanium nitride and titanium.

A cover insulating film 38 may be provided between each of the insulating layers 32 and the electric charge storage film 37. For example, the cover insulating film 38 includes silicon oxide. The cover insulating film 38 protects the electric charge storage film 37 from etching at the time of processing. The cover insulating film 38 may not be provided, or portions thereof may be left behind between the conductive layers 31 and the electric charge storage film 37 to be used as block insulating films.

Figure 3:
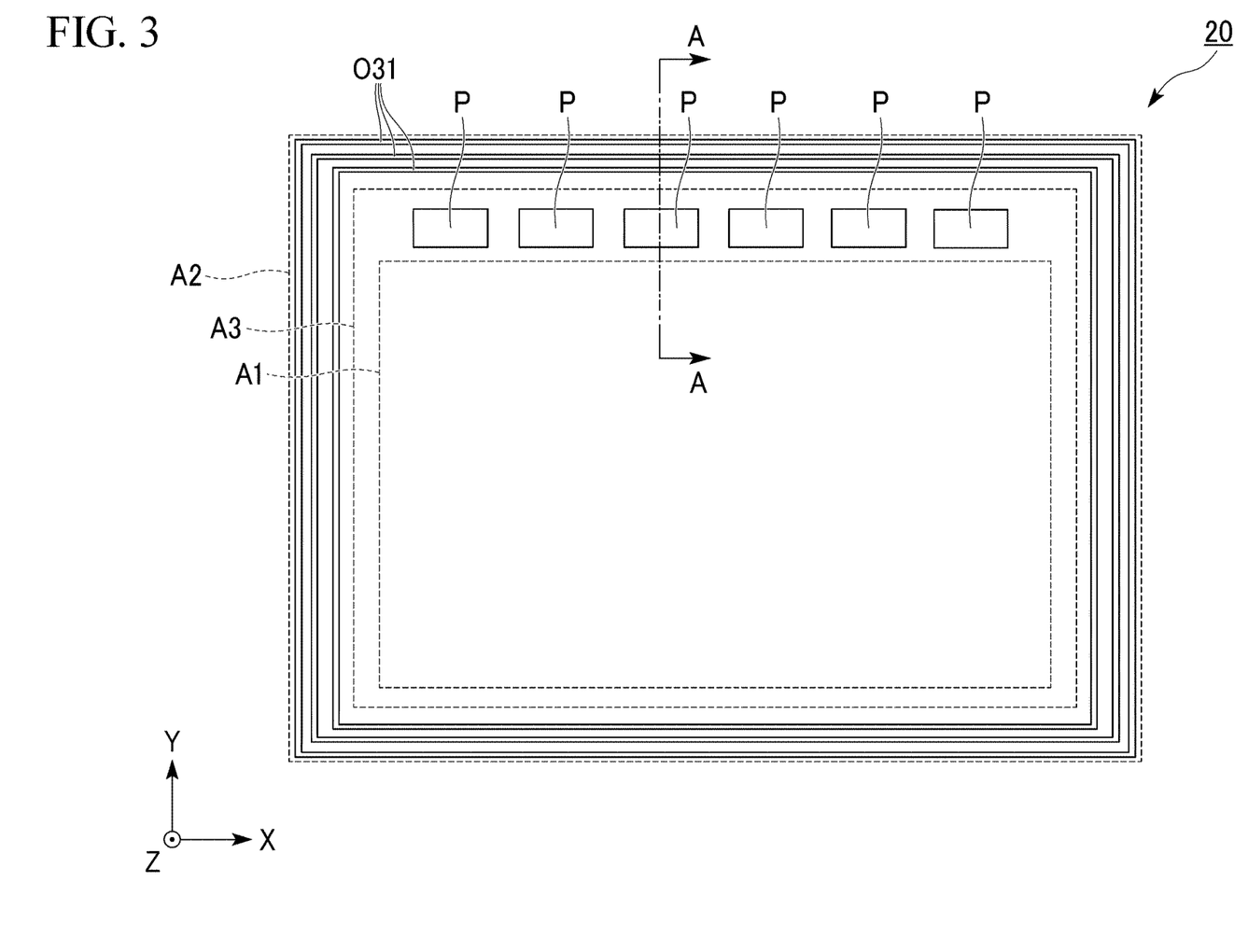
FIG. 3 is a plan view showing the semiconductor storage device of the first embodiment.

FIG. 3 is a plan view showing the laminate 20 of the semiconductor memory 100 of the first embodiment viewed in the Z direction. The laminate 20 included in the array chip 1 and the circuit chip 2 includes a first region A1, a second region A2, and a third region A3. FIG. 1 is a cross-sectional view along line A-A in FIG. 3.

When viewed in a plan view in the Z direction, the first region A1 is a region overlapping the memory cell array 30. The first region A1 includes the memory cell array 30. The first region A1 is a region that is referred to as a memory cell array region and stores data.

The second region A2 surrounds an area around the first region A1. The second region A2 includes a partition wall 40 (i.e., barrier wall) passing through the laminate 20 and extends from the first substrate 10 to the second substrate 50. The partition wall 40 surround an area around the memory cell array 30. A plurality of partition walls 40 may be provided such that the memory cell array 30 is surrounded by the plurality of partition walls 40. The partition wall 40 is constituted of the pads 21 and 26, the contact plugs 22 and 27, and the wirings 23 and 28. The partition wall 40 is referred to as an edge seal or a crack guide. The partition wall 40 includes metal. For example, the partition wall 40 curbs infiltration of moisture from a surrounding area to the memory cell array 30. For example, the partition wall 40 curbs cracking from occurring toward the memory cell array 30. The pads 21 and 26 are examples of first and second metal parts, respectively.

The third region A3 is provided between the first region A1 and the second region A2 when viewed in a plan view in the Z direction. For example, the third region A3 is provided on a flank side of any one side of the first region A1. For example, the third region A3 is provided on a flank side of the first region A1 in the X direction or the Y direction. The third region A3 is a region where a pad P exposed to outside is provided. The pad P is an example of an external connection pad. The pad P is a part of a metal layer 53. The pad P is a connection terminal for outside and is used when a signal is transmitted to outside or power is supplied to the circuit chip 2.

The second substrate 50 is provided on the laminate 20. The second substrate 50 is a substrate used when the array chip 1 is manufactured. For example, the second substrate 50 is a silicon substrate. For example, the second substrate 50 is made into a conductive region by injecting an impurity from a surface on the first substrate 10 side in the first region A1, and the region functions as a source line of the memory cell array 30. For example, a thickness of the second substrate 50 is smaller than a thickness of the first substrate 10.

In this embodiment, the conductive region is provided in the second substrate 50, and the region is caused to function as the source line, but the configuration of the source line is not necessarily limited thereto. For example, a conductive layer SL (not shown) functioning as the source line may be newly added to a part between the second substrate 50 and the conductive layer 31 (source side selection gate) that is the uppermost layer of the memory cell array 30. This part between the conductive layer SL and the second substrate 50 is electrically insulated, and an upper end of each semiconductor body 34 is connected to the conductive layer SL.

The second substrate 50 has a plurality of openings O21 and O31. The openings O21 are provided at positions overlapping the third region A3 in the Z direction. The openings O31 are provided at positions overlapping the second region A2 in the Z direction. The openings O31 are an example of "first openings". The openings O21 are an example of "second openings".

The openings O21 are studded in the third region A3. For example, the openings O21 are through holes having a rectangular or circular shape when viewed in the Z direction. The opening O21 internally includes an oxide layer 52 and the metal layer 53 in order from the outer side. The metal layer 53 electrically connect the contact plug 27 inside the laminate 20 to outside. A part of the metal layer 53 serves as the pad P exposed to outside. For example, the oxide layer 52 is made of silicon oxide.

For example, the openings O31 are continuous penetration grooves when viewed in the Z direction. The opening O31 continuously surrounds areas around the first region A1 and the third region A3. A plurality of openings O31 may be provided such that areas around the first region A1 and the third region A3 are surrounded by the plurality of openings O31.

Figure 4:
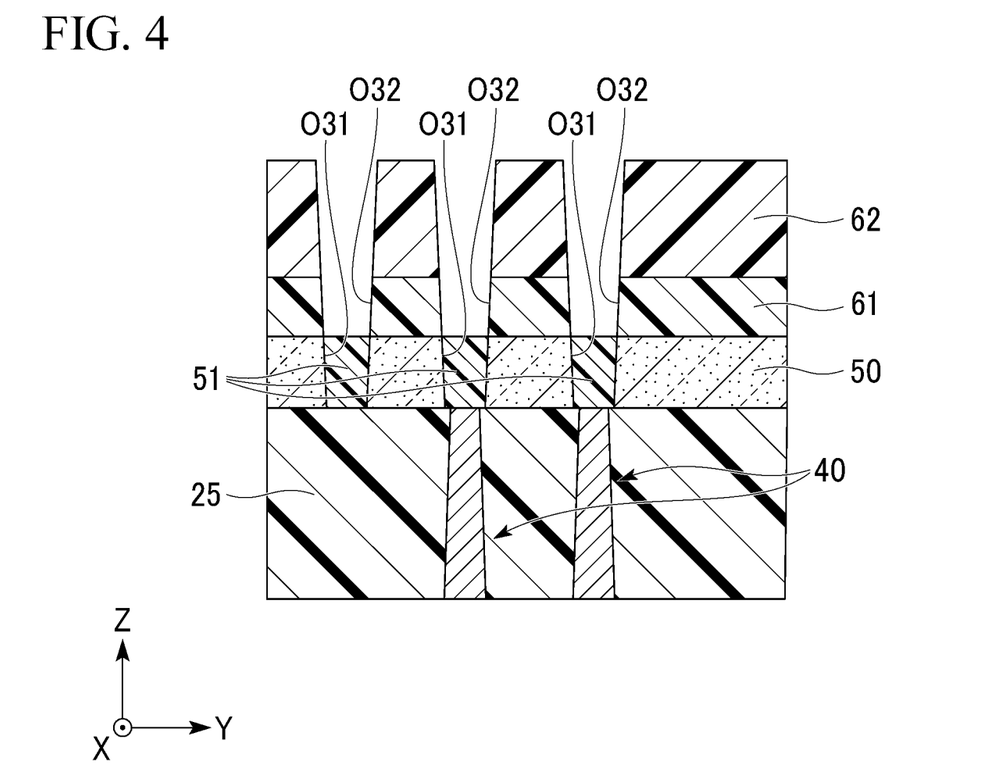
FIG. 4 is an enlarged view showing a part of the semiconductor storage device of the first embodiment.

FIG. 4 is an enlarged cross-sectional view showing an area in the vicinity of the openings O31 of the semiconductor memory 100 of the first embodiment. For example, the openings O31 are provided at positions overlapping the partition wall 40 in a plan view in the Z direction. At least a part of the opening O31 overlaps the partition wall 40 in a plan view in the Z direction. The opening O31 may be provided at a position deviated from the partition wall 40 in a plan view in the Z direction. For example, the opening O31 may be provided on the first region A1 side from the partition wall 40 in a plan view in the Z direction. That is, the opening O31 is closer to the first region A1 than the partition wall 40 is when viewed in the first direction. For example, an inside of the opening O31 is filled with oxide 51. For example, the oxide 51 is made of silicon oxide.

The insulating layer 61 is provided on the second substrate 50. The insulating layer 62 is provided on the insulating layer 61. The insulating layers 61 and 62 are passivation films for protecting the laminate 20. For example, the insulating layer 61 is made of silicon oxide. For example, the insulating layer 62 is a polyimide film.

The insulating layers 61 and 62 have a plurality of openings O22 and O32. The openings O22 are provided at positions overlapping the third region A3 in the Z direction. The openings O32 are provided at positions overlapping the second region A2 in the Z direction. The openings O32 are an example of "third openings". The openings O22 are provided at positions overlapping the metal layers 53. The metal layers 53 exposed from the openings O22 serve as the pads P. The openings O32 are provided at positions overlapping the openings O31 or on the first region A1 side from positions overlapping the openings O31 when viewed in the Z direction. That is, at least a part of the opening O32 overlaps the opening O31 in a plan view in the Z direction. The opening O32 may be closer to the first region A1 than the opening O31 40 is when viewed in the first direction.

Next, a method of manufacturing the semiconductor memory 100 of the first embodiment will be described. The semiconductor memory 100 is manufactured by bonding an array wafer W1 including a plurality of array chips 1 and a circuit wafer W2 including a plurality of circuit chips 2 to each other. The array wafer W1 is also referred to as a memory wafer. The circuit wafer W2 is also referred to as a CMOS wafer.

Figure 5:
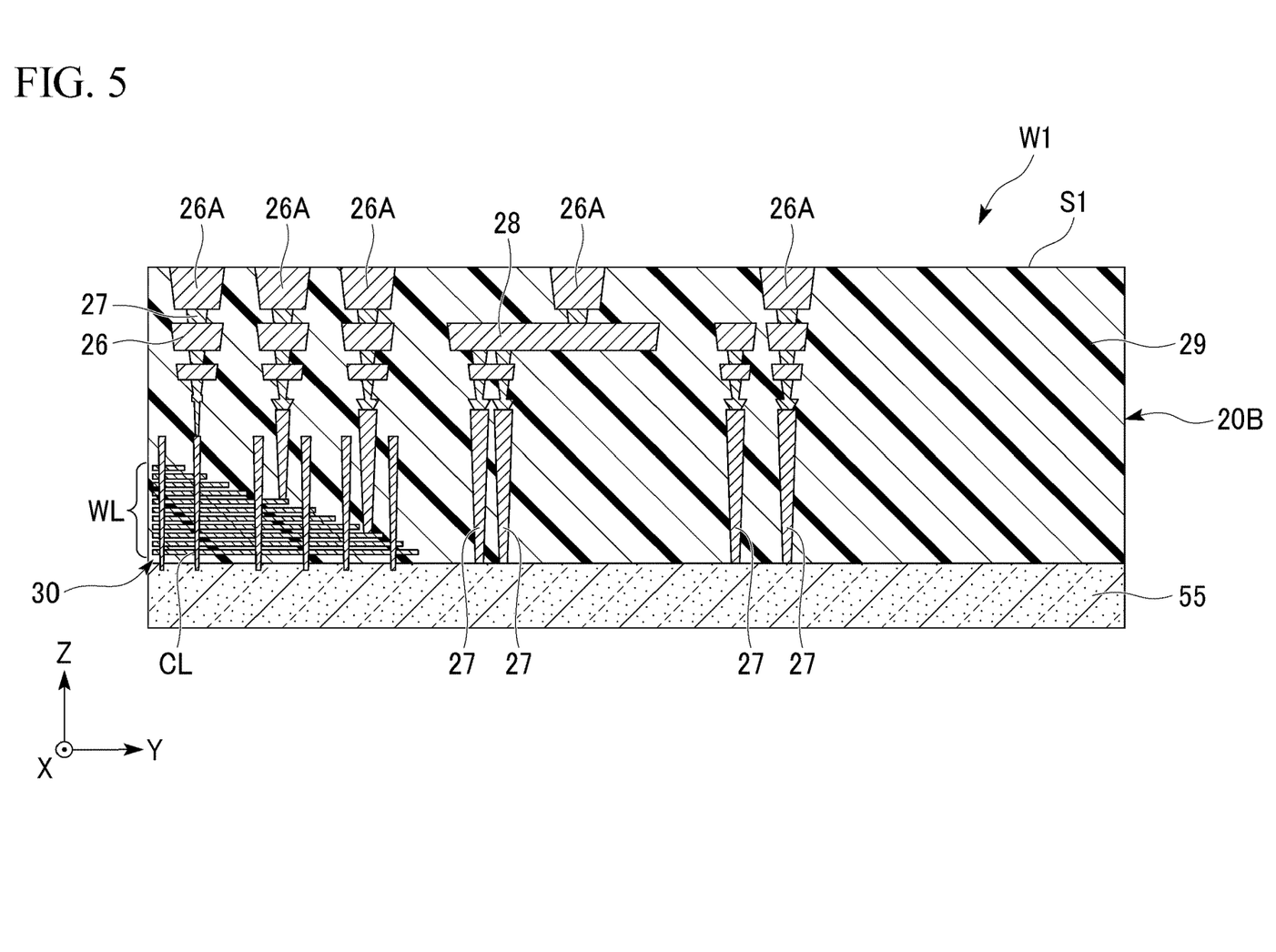
FIG. 5 is a cross-sectional view showing a method of manufacturing the semiconductor storage device of the first embodiment.
Figure 6:
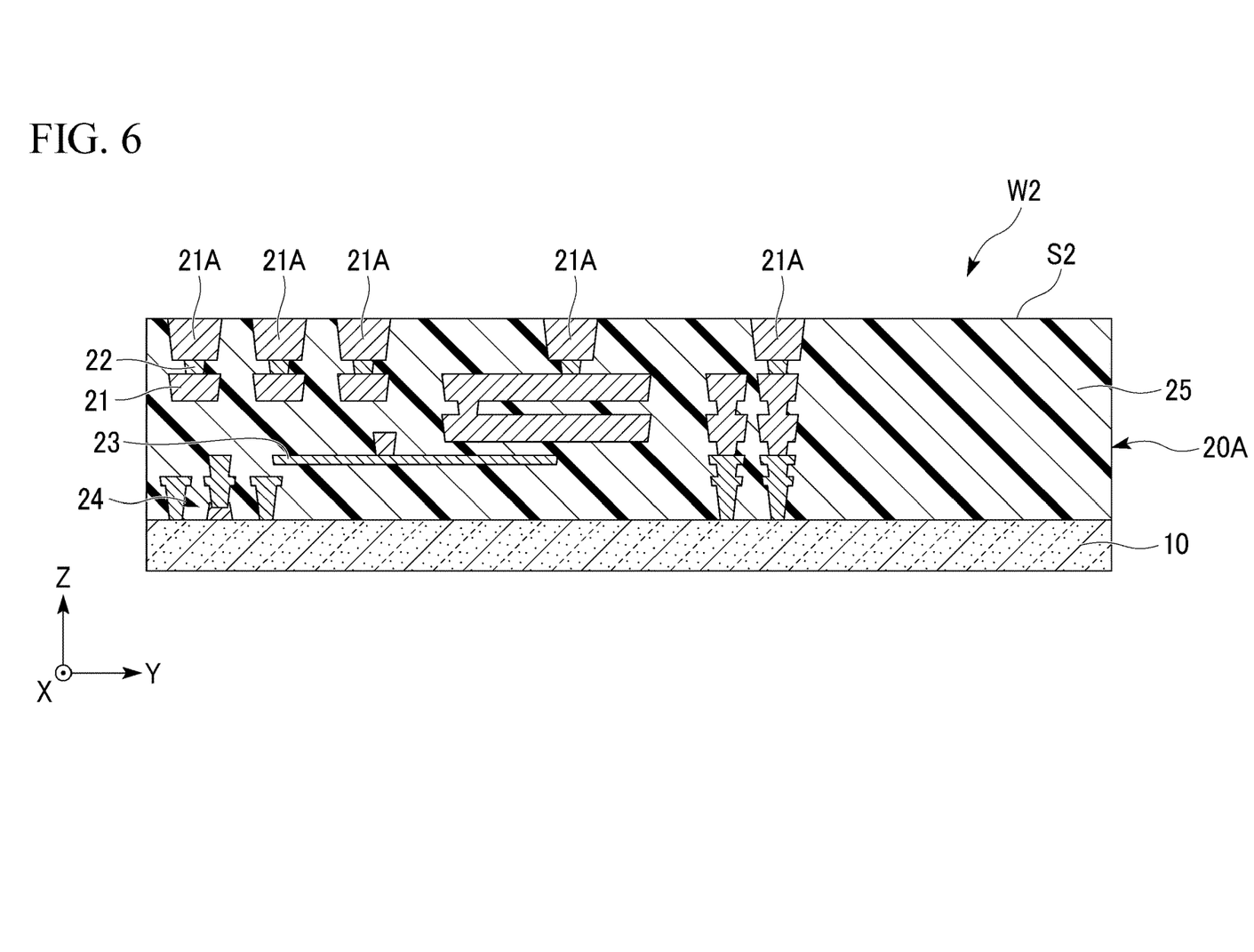
FIG. 6 is a cross-sectional view showing the method of manufacturing the semiconductor storage device of the first embodiment.

FIG. 5 is a cross-sectional view showing a part of the array wafer W1. FIG. 6 is a cross-sectional view showing a part of the circuit wafer W2. The array wafer W1 includes a plurality of array chips 1 (refer to FIG. 1). FIG. 5 is an enlarged view of an area in the vicinity of one array chip 1. The part of the array wafer W1 shown in FIG. 5 is in a state before being bonded to the circuit wafer W2 and is reversed upside down with respect to the array chip 1 shown in FIG. 1. The circuit wafer W2 includes a plurality of circuit chips 2 (refer to FIG. 1). FIG. 6 is an enlarged view of an area in the vicinity of one circuit chip 2 of the circuit wafer W2.

The array wafer W1 is obtained by laminating the laminate 20B on a substrate 55. The laminate 20B includes the memory cell array 30, the pads 26, the contact plugs 27, the wirings 28, and the insulating film 29. These are formed for each layer. The array wafer W1 is produced by repeating film formation of each of these layers and processing of photolithography or the like. A known method can be used as a film formation method and a processing method. The insulating film 29 is formed between the memory cell array 30, the pads 26, the contact plugs 27, and the wirings 28. A plurality of pads 26A are exposed to a bonding surface S1 on a side opposite to the substrate 55 of the array wafer W1.

The circuit wafer W2 is obtained by laminating the laminate 20A on the first substrate 10. The laminate 20A includes the pads 21, the contact plugs 22, the wirings 23, the transistors 24, and the insulating film 25. These are formed for each layer. The circuit wafer W2 is produced by repeating film formation of each of these layers and processing of photolithography or the like. A known method can be used as a film formation method and a processing method. The insulating film 25 is formed between the pads 21, the contact plugs 22, the wirings 23, and the transistors 24. A plurality of pads 21A are exposed to a bonding surface S2 on a side opposite to the first substrate 10 of the circuit wafer W2.

Next, the bonding surface S1 of the array wafer W1 and the bonding surface S2 of the circuit wafer W2 are caused to face each other, and the array wafer W1 and the circuit wafer W2 are bonded to each other due to a mechanical pressure. Accordingly, the insulating film 25 and the insulating film 29 adhere to each other. Next, the array wafer W1 and the circuit wafer W2 are annealed at 400° C. Accordingly, the pads 21A and the pads 26A are bonded to each other.

Figure 7:
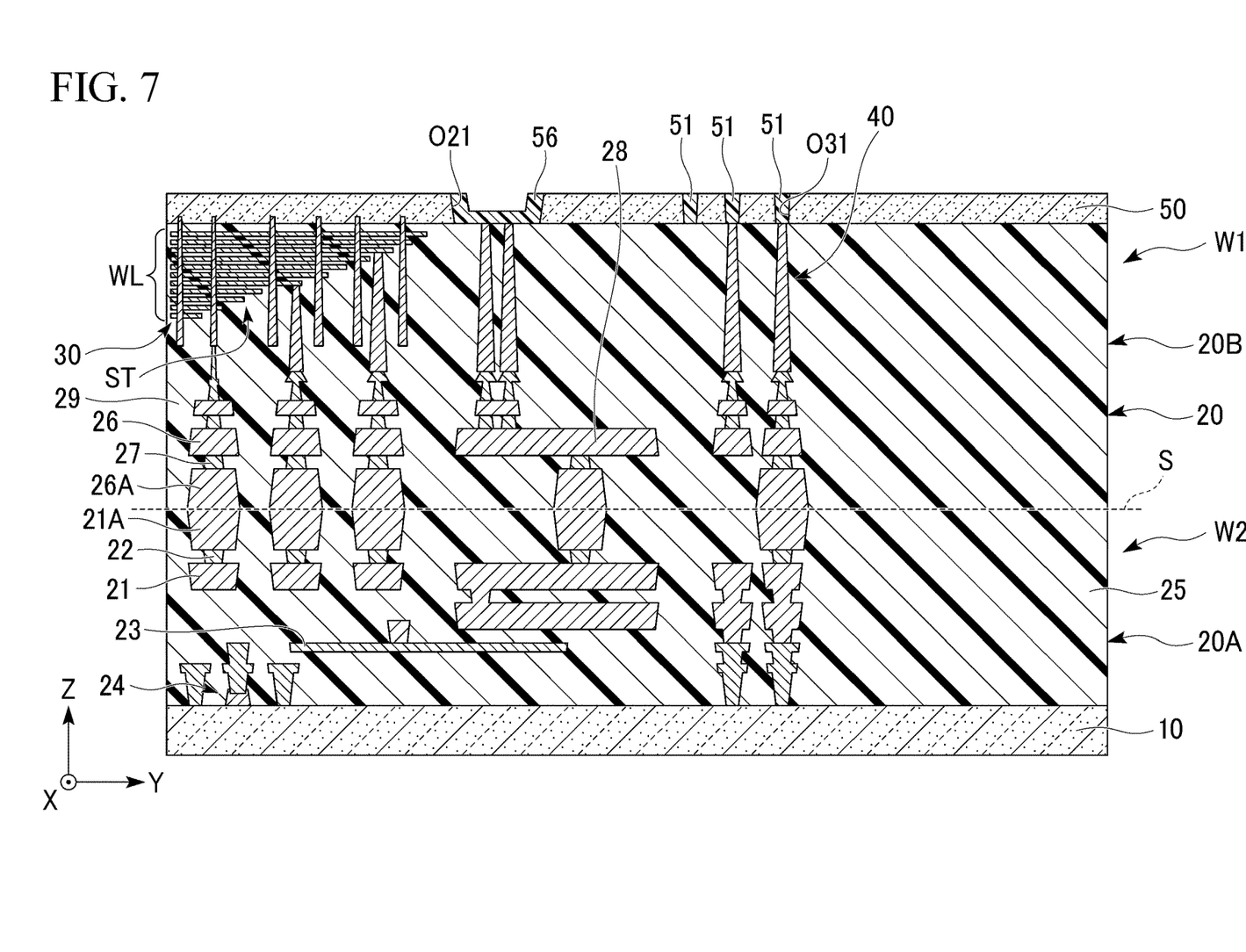
FIG. 7 is a cross-sectional view showing the method of manufacturing the semiconductor storage device of the first embodiment.

After the array wafer W1 and the circuit wafer W2 are bonded to each other, the substrate 55 is thinned. Accordingly, the substrate 55 becomes the second substrate 50. For example, the substrate 55 is thinned by chemical-mechanical polishing (CMP). Next, as shown in FIG. 7, the openings O21 and O31 are formed in the second substrate 50. For example, the openings O21 and the openings O31 are formed simultaneously. An oxide layer is laminated on the second substrate 50. Parts of the oxide layer covers the inner surfaces of the openings O21 and the openings O31. Thereafter, in the oxide layer, parts other than regions overlapping the openings O21 and O31 are removed. A oxide layer 56 is formed inside the openings O21, and the insides of the openings O31 are filled with the oxides 51.

Figure 8:
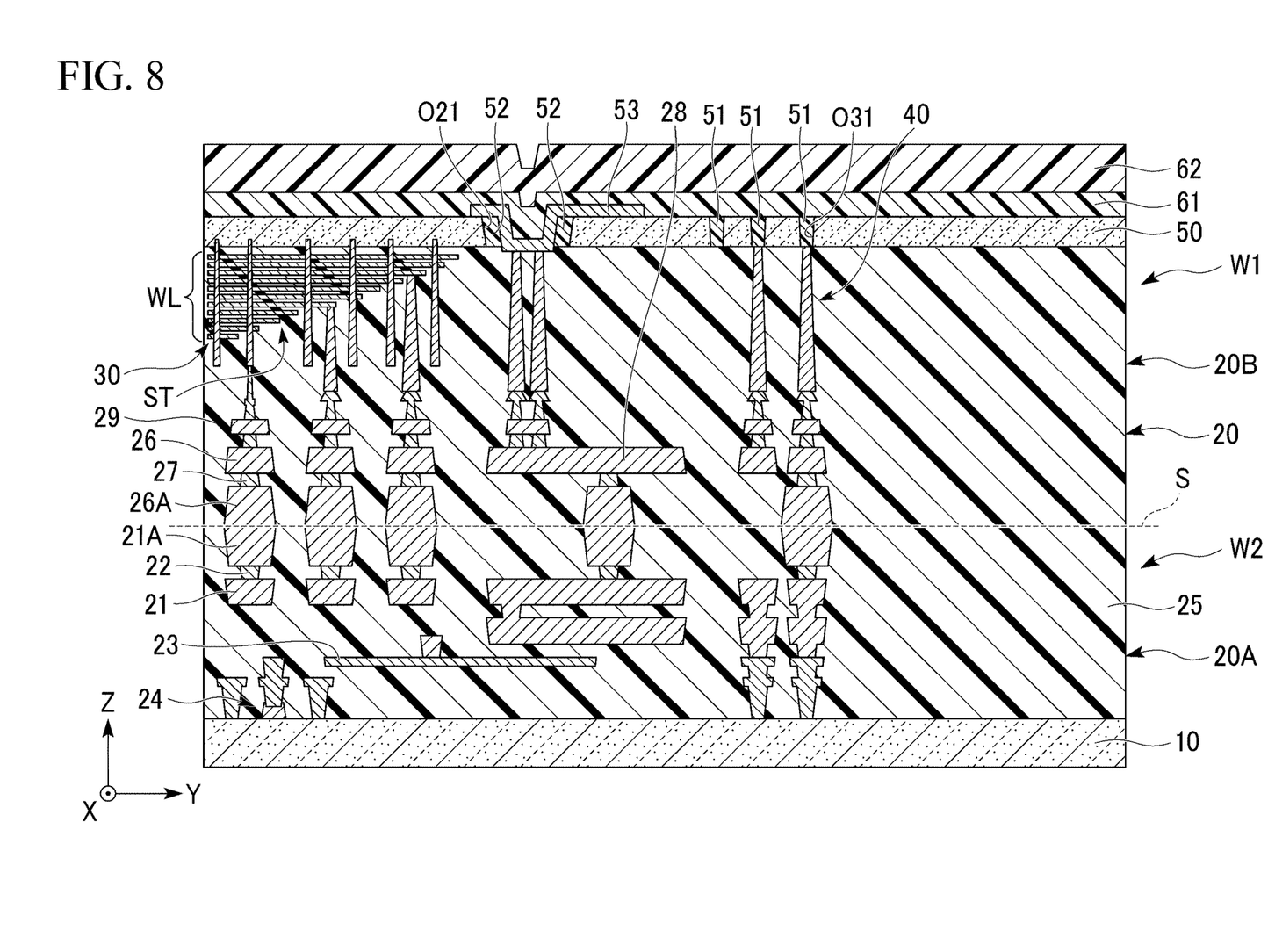
FIG. 8 is a cross-sectional view showing the method of manufacturing the semiconductor storage device of the first embodiment.

Next, as shown in FIG. 8, through holes are formed in the oxide layer 56, and the metal layer 53 are laminated. The remaining parts of the oxide layer 56 become the oxide layer 52. Further, the insulating layers 61 and 62 are laminated on the second substrate 50 in order.

Figure 9:
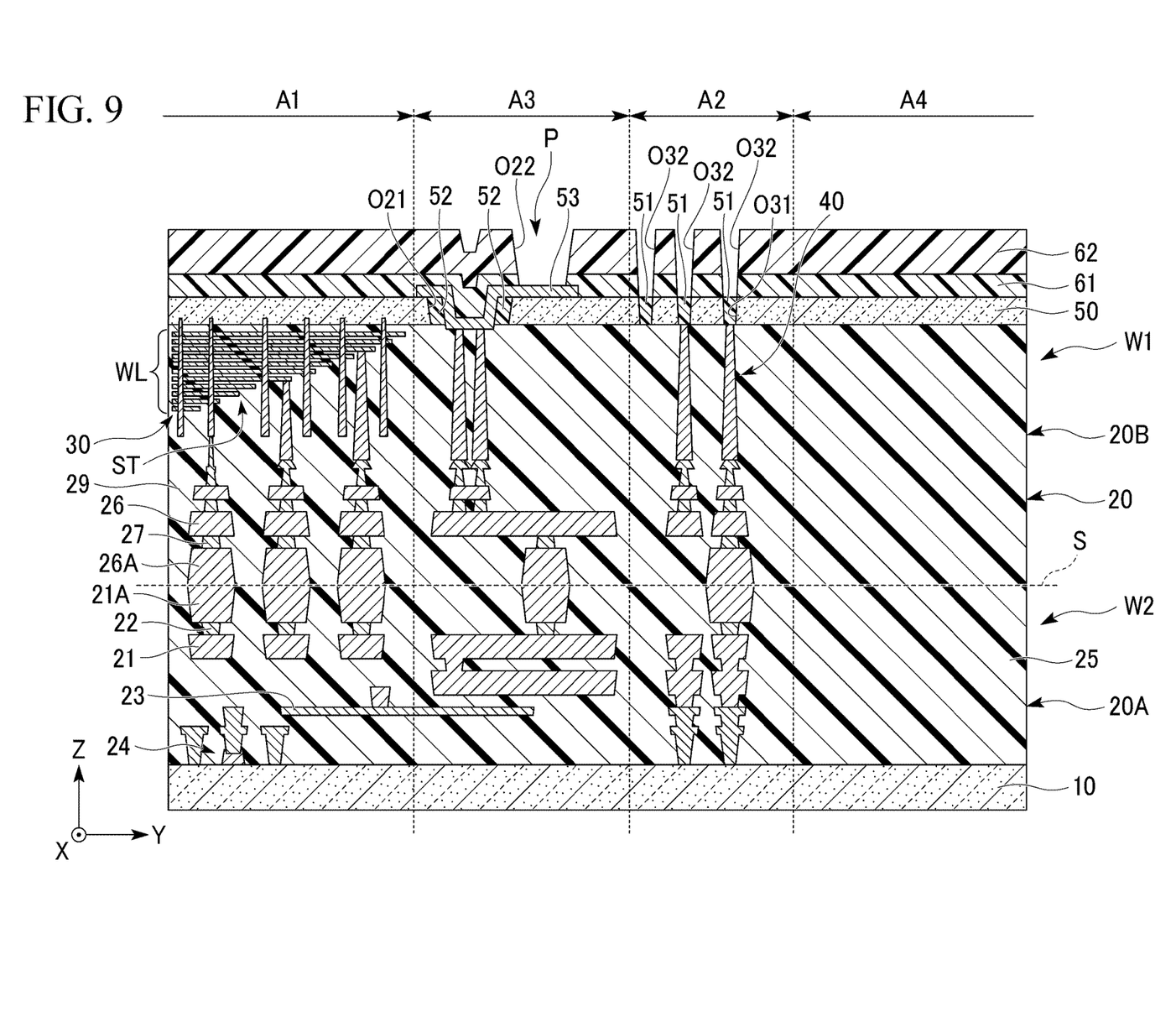
FIG. 9 is a cross-sectional view showing the method of manufacturing the semiconductor storage device of the first embodiment.

Next, as shown in FIG. 9, the openings O22 and O32 are formed in the insulating layers 61 and 62. By forming the openings O22, parts of the metal layers 53 are exposed and become the pads P. The opening O32 extends to the oxide 51.

Figure 10:
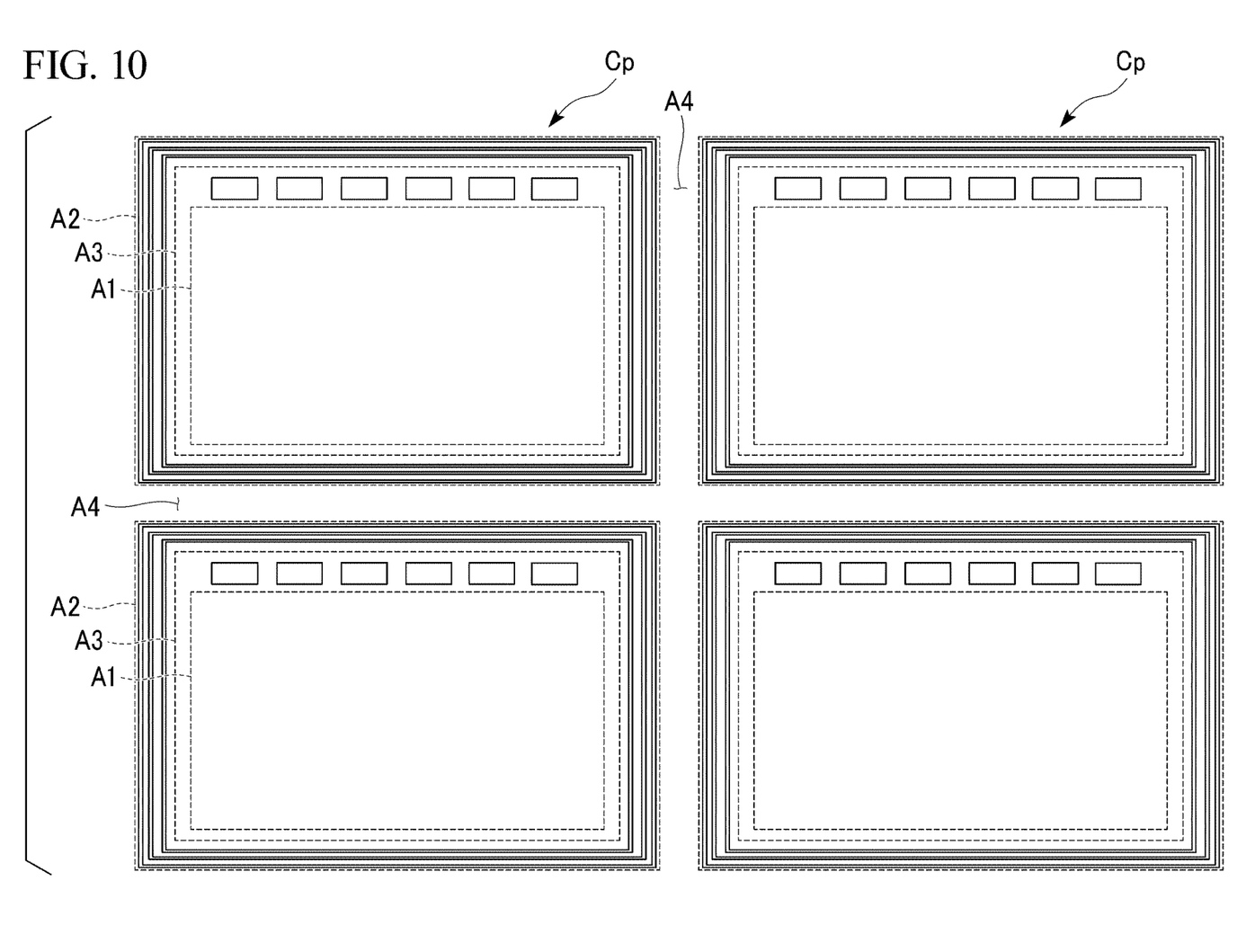
FIG. 10 is a plan view showing the method of manufacturing the semiconductor storage device of the first embodiment.

FIG. 10 is a plan view showing a bonded body in which the array wafer W1 and the circuit wafer W2 are bonded to each other in the Z direction. The bonded body has a plurality of chip regions Cp. For example, the chip regions Cp are constituted of the first region A1, the second region A2, and the third region A3. A fourth region A4 is provided between adjacent chip regions Cp. As shown in FIG. 9, in the laminate 20, structures such as the pads 21 and 26, the contact plugs 22 and 27, and the wirings 23 and 28 are not provided in the fourth region A4, and the fourth region A4 is constituted of the insulating films 25 and 29. The fourth region A4 is a dicing line used when the bonded body is cut into a plurality of chips.

Next, the bonded body is cut along the dicing line (fourth region A4), and thus a plurality of chips are obtained. Dicing is performed from the second substrate 50 side of the bonded body. Through the steps described above, the semiconductor memory 100 according to the embodiment is manufactured. The manufacturing steps described herein are an example, and other steps may be inserted between the steps.

When a bonded body is cut, unintended cracking may occur in the bonded body. Also, in addition to the case of cutting, distortion which has occurred in a bonded body at the time of cutting may cause cracking during a following step such as annealing. If cracking reaches a storage region or a control region of the semiconductor memory 100, the chip becomes defective. Cracking is likely to grow along an interface between different materials. For example, cracking grows along an interface between a silicon oxide film and a silicon carbonitride film in the insulating film 25.

In the semiconductor memory 100 according to the first embodiment, since the opening O31 is formed in the second substrate 50, transfer of cracking to the storage region or the control region of the semiconductor memory 100 can be curbed. Cracking is likely to grow along an interface between different materials and is likely to grow along the opening O31 and the partition wall 40. Cracking which has occurred within an XY plane along an interface between the silicon oxide film and the silicon carbonitride film in the fourth region A4 at the time of dicing is turned in the Z direction due to the opening O31 and the partition wall 40. By causing cracking to proceed in the Z direction due to the openings O31 and the partition wall 40, transfer of cracking to the storage region or the control region of the semiconductor memory 100 can be curbed.

First Modification Example

Figure 11:
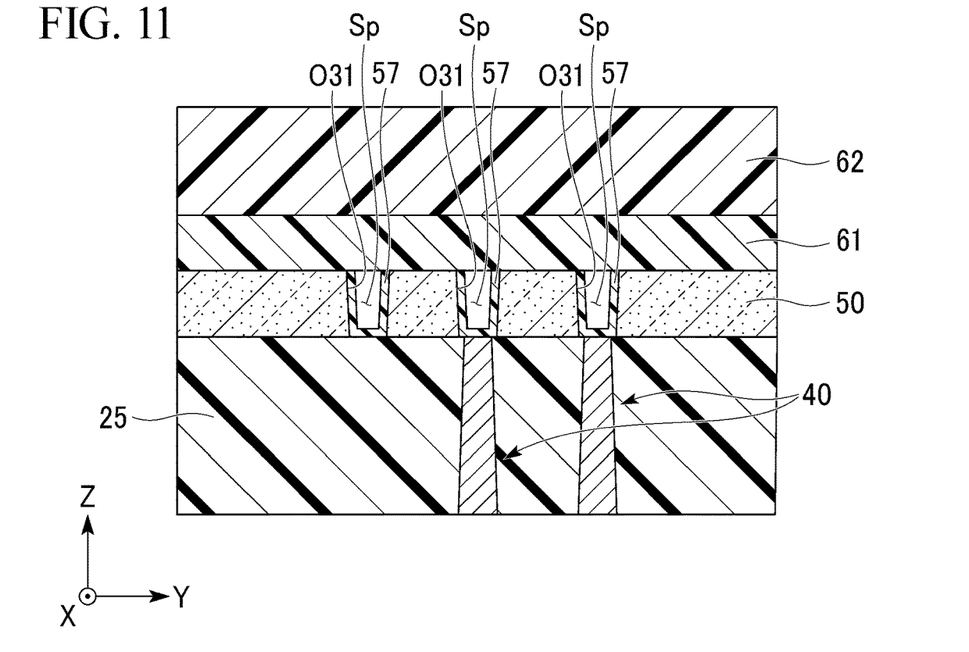
FIG. 11 is an enlarged view showing a part of a semiconductor storage device of a first modification example.

A first modification example of the semiconductor memory 100 according to the first embodiment will be described. FIG. 11 is an enlarged cross-sectional view showing an area in the vicinity of the openings O31 of a semiconductor memory of the first modification example. The semiconductor memory of the first modification example has a configuration similar to that of the semiconductor memory 100 of the first embodiment except for those described below.

The second substrate 50 has the openings O31. The inner surfaces of the openings O31 are covered with oxide layers 57. Spaces Sp surrounded by the oxide layers 57 and the insulating layer 61 are provided on the inner sides of the oxide layers 57. As illustrated in FIG. 11, the insulating layers 61 and 62 may not have a plurality of openings O22 and O32. Similar to the first embodiment, the insulating layers 61 and 62 may have a plurality of openings O22 and O32.

The oxide layers 57 can be simultaneously laminated when the oxide layers 56 are laminated inside the openings O21. When the widths of the openings O31 are sufficiently larger than the thicknesses of the oxide layers 57 to be subjected to film formation, the spaces Sp are formed by performing film formation of the oxide layers 57. When the insides of the openings O31 are filled with oxides, the oxide layers 57 and the spaces Sp can be obtained by removing portions of filled oxides.

Even in the configuration according to the first modification example, similar to the first embodiment, growth of cracking to the storage region or the control region of the semiconductor memory can be curbed.

Second Modification Example

Figure 12:
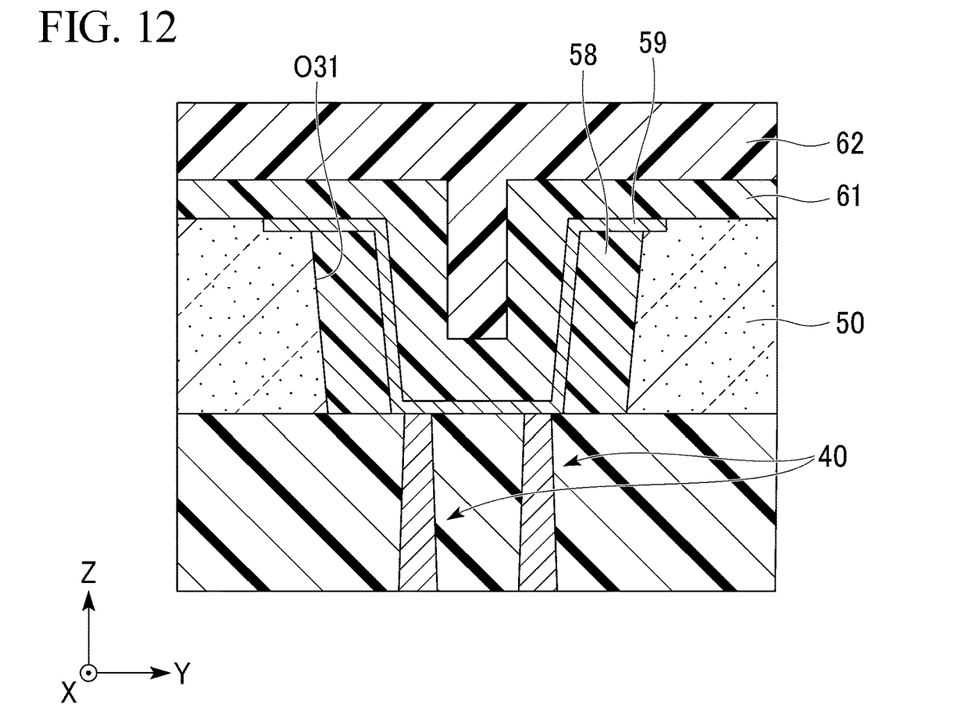
FIG. 12 is an enlarged view showing a part of a semiconductor storage device of a second modification example.

A second modification example of the semiconductor memory 100 of the first embodiment will be described. FIG. 12 is an enlarged cross-sectional view showing an area in the vicinity of the openings O31 of a semiconductor memory of the second modification example. The semiconductor memory of the second modification example has a configuration similar to that of the semiconductor memory 100 of the first embodiment except for those described below.

The second substrate 50 has the openings O31. The inner surfaces of the openings O31 are covered with oxide layers 58 and metal layers 59 in order from the inner side. The oxide layers 58 covers side walls of the openings O31. The metal layers 59 cover bottom surfaces and the side walls of the openings O31. As shown in FIG. 12, the inners side of the metal layers 59 may be covered with the insulating layers 61 and 62. The semiconductor memory 100 of the second modification example includes a plurality of partition walls 40. The openings O31 are provided over the plurality of partition walls 40 when viewed in the Z direction. That is, the opening O31 is provided over a part of one partition wall 40 included in the plurality of partition walls 40 and a part of another partition wall 40 included in the plurality of partition walls 40 when viewed in the first direction.

The oxide layers 58 and the metal layers 59 are simultaneously produced when the oxide layers 52 and the metal layers 53 are formed inside the openings O21.

Even in the configuration according to the second modification example, similar to the first embodiment, growth of cracking to the storage region or the control region of the semiconductor memory can be curbed.

Third Modification Example

Figure 13:
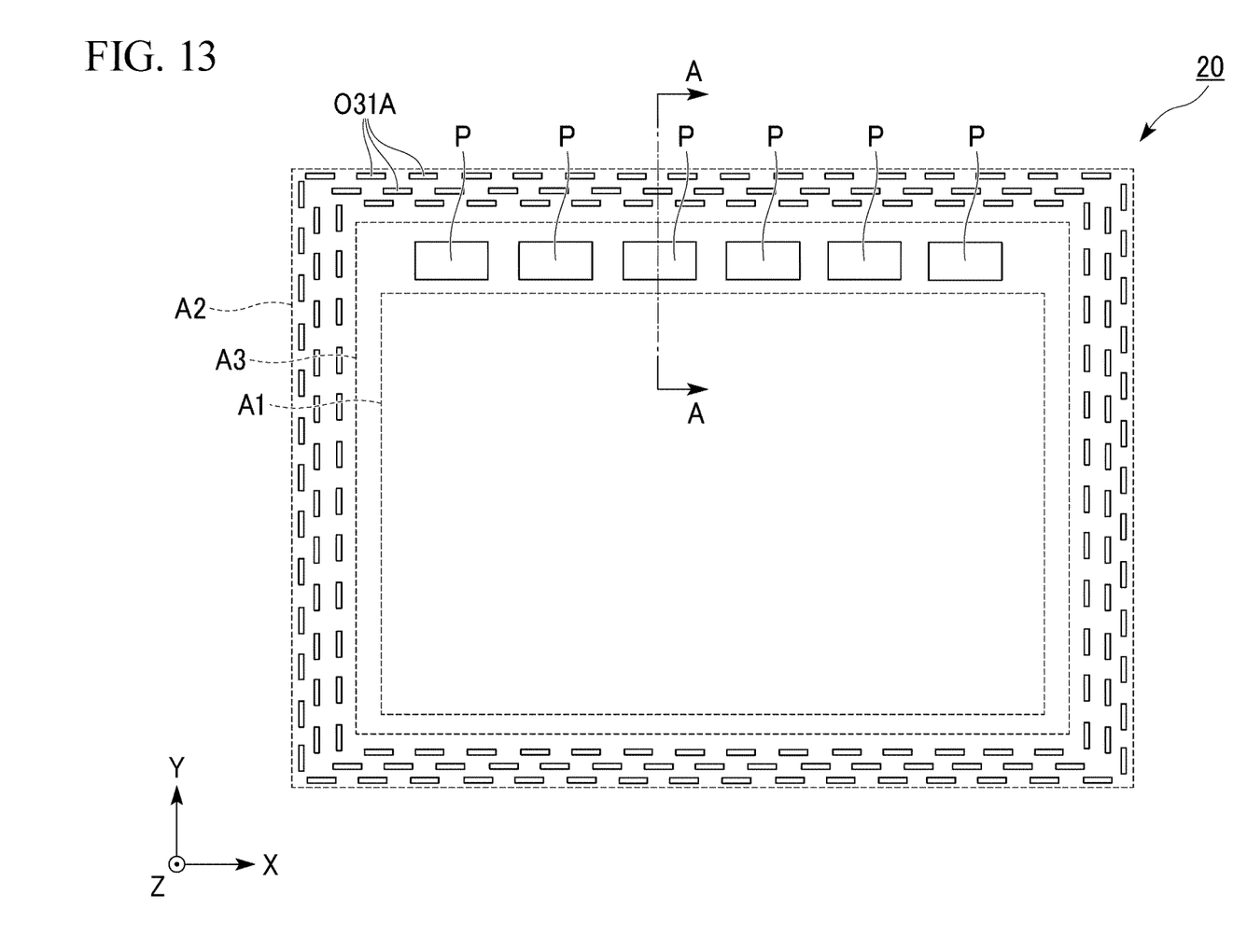
FIG. 13 is a plan view showing a semiconductor storage device of a third modification example.

A third modification example of the semiconductor memory 100 of the first embodiment will be described. FIG. 13 is a plan view showing the semiconductor memory of the third modification example in the Z direction. The semiconductor memory of the third modification example has a configuration similar to that of the semiconductor memory 100 of the first embodiment except for those described below.

The openings O31 according to the first embodiment are penetration grooves continuously surrounding the areas of the first region A1 and the third region A3, whereas openings O31A according to the third modification example are studded around the first region A1 and the third region A3. A plurality of openings O31A surround the first region A1 and the third region A3 when viewed in the Z direction. A plurality of opening groups may surround the first region A1 and the third region A3.

Even in the configuration according to the third modification example, similar to the first embodiment, growth of cracking to the storage region and the control region of the semiconductor memory can be curbed.

Fourth Modification Example

Figure 14:
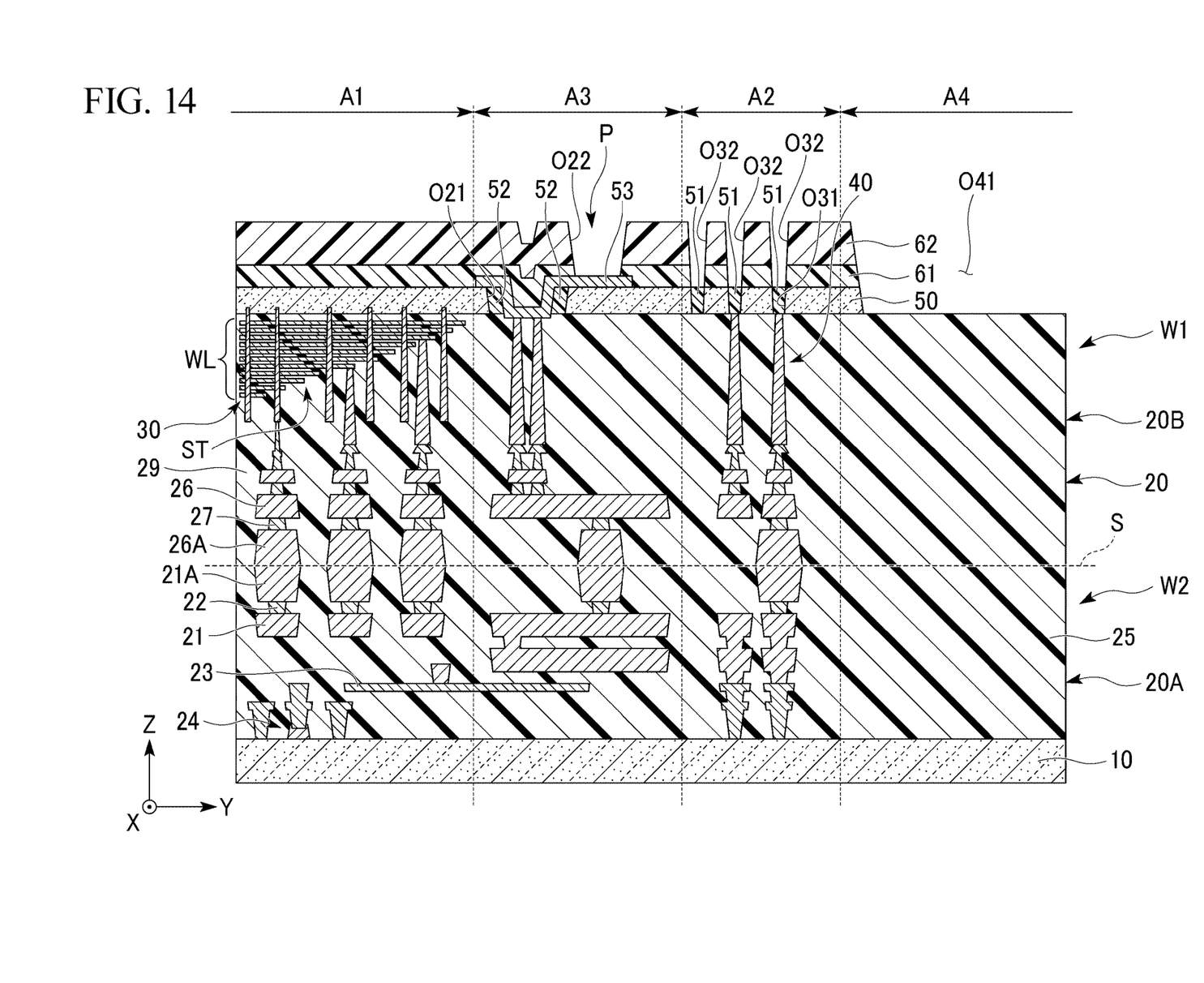
FIG. 14 is a cross-sectional view showing a semiconductor storage device of a fourth modification example.

A fourth modification example showing the semiconductor memory 100 of the first embodiment will be described. FIG. 14 is a cross-sectional view showing the semiconductor memory of the fourth modification example. The semiconductor memory shown in FIG. 14 is a wafer in which a plurality of chips are integrated and is in a state before dicing processing. The semiconductor memory shown in FIG. 14 differs from that in FIG. 9 in that an opening O41 is formed in the fourth region A4. Similar reference signs are applied to configurations similar to those in FIG. 9, and description will be omitted.

The opening O41 is provided in the fourth region A4. The opening O41 is an example of "fourth opening". The opening O41 passes through the second substrate 50, the insulating layer 61, and the insulating layer 62 and is in contact with the laminate 20. For example, the opening O41 extends along the fourth region A4. The openings O41 can be simultaneously formed with the openings O31 and O32. The openings O41 may be connected to the openings O31 and O32 closest to the fourth region A4 side.

Even in the configuration according to the fourth modification example, similar to the first embodiment, growth of cracking to the storage region and the control region of the semiconductor memory can be curbed. In addition, since the second substrate 50 is not present in the dicing line, cracking at the time of dicing can be further curbed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first chip including a first substrate, a transistor, and a first pad, the transistor being on the first substrate, the first pad being above the transistor; and
   a second chip including a second pad, a memory cell array, and a second substrate, the second pad being on the first pad, the memory cell array being above the second pad and including a plurality of memory cells, the second substrate being above the memory cell array, the second chip being bonded to the first chip,
   wherein
   the first chip and the second chip includes, when viewed in a first direction orthogonal to the first substrate, a first region and a second region, the first region including the memory cell array, the second region surrounding an area around the first region and including a wall extending from the first substrate to the second substrate, and the second substrate includes a first opening passing through the second substrate in the second region.

2. The semiconductor storage device according to claim 1, wherein the first chip and the second chip further includes a third region between the first region and the second region when viewed in the first direction, the third region including an external connection pad, and the second substrate includes a second opening passing through the second substrate in the third region.

3. The semiconductor storage device according to claim 1, wherein the first opening continuously surrounds the first region when viewed in the first direction.

4. The semiconductor storage device according to claim 1, wherein the second substrate includes a plurality of openings each of which passes through the second substrate in the second region, the plurality of openings including the first opening, and each of the plurality of openings surrounds the first region when viewed in the first direction.

5. The semiconductor storage device according to claim 1, wherein the first opening is filled with oxide.

6. The semiconductor storage device according to claim 2, wherein the first opening is filled with oxide, and the second opening is filled with the same oxide as the oxide in the first opening.

7. The semiconductor storage device according to claim 1 further comprising:

an oxide layer covering an inner surface of the first opening.

8. The semiconductor storage device according to claim 7 further comprising:

a metal layer covering an inner surface of the oxide layer.

9. The semiconductor storage device according to claim 1 further comprising:

a plurality of walls each of which extends from the first substrate to the second substrate, the plurality of walls including the wall, and the first opening is provided over a part of one wall included in the plurality of walls and a part of another wall included in the plurality of walls when viewed in the first direction.

10. The semiconductor storage device according to claim 1, wherein a thickness of the second substrate is smaller than a thickness of the first substrate.

11. The semiconductor storage device according to claim 1 further comprising:

an insulating layer on the second substrate, wherein the insulating layer includes a third opening at a position overlapping the first opening when viewed in the first direction.

12. The semiconductor storage device according to claim 1 further comprising:

an insulating layer on the second substrate, wherein the insulating layer includes a third opening, and the third opening is, when viewed in the first direction, closer to the first region than the first opening is.

13. The semiconductor storage device according to claim 1, wherein the first chip and the second chip includes a plurality of chip regions, each of the plurality of chip regions including the first region and the second region, and the second substrate includes a fourth region between adjacent chip regions included in the plurality of chip regions, the fourth region including a fourth opening.

14. The semiconductor storage device according to claim 1, wherein the wall includes metal.

15. The semiconductor storage device according to claim 1, wherein the wall includes a first metal part and a second metal part, the first metal part being included in the first chip, the second metal part being included in the second chip and bonded to the first metal part.

16. The semiconductor storage device according to claim 1, wherein at least a part of the first opening overlaps the wall when viewed in the first direction.

17. The semiconductor storage device according to claim 1, wherein the first opening is, when viewed in the first direction, closer to the first region than the wall is.

18. The semiconductor storage device according to claim 1, wherein the second substrate includes a plurality of openings each of which passes through the second substrate in the second region, the plurality of openings including the first opening, and the plurality of openings are deposed along an area around the first region when viewed in the first direction.

19. A method of manufacturing a semiconductor storage device comprising:

producing a first chip by forming a transistor and a first pad with respect to a first substrate;

producing a second chip by forming a memory cell array and a second pad with respect to a second substrate;

bonding the first chip and the second chip such that the first pad and the second pad are bonded to each other; and forming a first opening and a second opening simultaneously, the first opening passing through the second substrate in a second region of the second substrate, the second opening passing through the second substrate in a third region of the second substrate, wherein the second region is a region which surrounds an area around a first region, the first region including the memory cell array, the second region including a wall extending from the first substrate to the second substrate, and wherein the third region is a region between the first region and the second region.

20. The method of manufacturing a semiconductor storage device according to claim 19, further comprising:

forming an oxide layer for covering an inner surface of the first opening and an inner surface of the second opening.

* * * * *